United States Patent
Liu et al.

(10) Patent No.: US 11,692,946 B2
(45) Date of Patent: Jul. 4, 2023

(54) METHOD FOR ALIGNING TO A PATTERN ON A WAFER

(71) Applicant: United Semiconductor (Xiamen) Co., Ltd., Fujian (CN)

(72) Inventors: Dian Han Liu, Shamen (CN); Maohua Ren, Shamen (CN); Yuan-Chi Pai, Fujian (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 121 days.

(21) Appl. No.: 17/317,906

(22) Filed: May 12, 2021

(65) Prior Publication Data
US 2022/0299448 A1    Sep. 22, 2022

(30) Foreign Application Priority Data
Mar. 19, 2021   (CN) .......................... 202110295665.X (51) Int. Cl.
   *G01N 21/95*      (2006.01)
   *H01L 21/67*      (2006.01)
   *H01L 21/66*      (2006.01)
   *H01L 23/544*     (2006.01)

(52) U.S. Cl.
   CPC ... *G01N 21/9501* (2013.01); *H01L 21/67253* (2013.01); *H01L 22/20* (2013.01); *H01L 23/544* (2013.01)

(58) Field of Classification Search
   CPC .......... G01N 21/9501; H01L 21/67253; H01L 22/20; H01L 23/544; H01L 22/10; G03F 7/70616

USPC ......................................... 356/490–509, 250
See application file for complete search history.

(56) References Cited

U.S. PATENT DOCUMENTS

| | | | |
|---|---|---|---|
| 7,349,575 | B2 | 3/2008 | Hattori |
| 11,249,404 | B2 | 2/2022 | Schmitt-Weaver |
| 2008/0013089 | A1 | 1/2008 | Ishii |
| 2011/0133066 | A1* | 6/2011 | Nozoe ............... H01L 22/12 250/252.1 |
| 2018/0264712 | A1* | 9/2018 | Asano ............... B29C 59/002 |
| 2020/0159124 | A1* | 5/2020 | Wang ............... G03F 7/70616 |

FOREIGN PATENT DOCUMENTS

| | | |
|---|---|---|
| CN | 1576782 A | 2/2005 |
| CN | 104576430 A | 4/2015 |
| CN | 106548953 A | 3/2017 |
| CN | 110770653 A | 2/2020 |
| CN | 110827357 A | 2/2020 |
| CN | 112215304 A | 1/2021 |
| JP | 2000-21769 A | 1/2000 |

(Continued)

*Primary Examiner* — Tri T Ton
(74) *Attorney, Agent, or Firm* — Winston Hsu (57) ABSTRACT

A method for aligning to a pattern on a wafer is disclosed. The method includes the steps of obtaining a first inline image from a first sample wafer, obtaining a first contour pattern of an alignment mark pattern from the first inline image, using the first contour pattern to generate a first synthetic image in black and white pixels, using the first synthetic image as a reference to recognize the alignment mark pattern on a tested wafer, and aligning to a tested pattern on the tested wafer according to a position of the alignment mark pattern on the tested wafer and a coordinate information.

16 Claims, 9 Drawing Sheets

(56) References Cited

FOREIGN PATENT DOCUMENTS

| | | |
|---|---|---|
| JP | 2015-112859 A | 6/2015 |
| KR | 2001-0058689 A | 7/2001 |
| KR | 10-2005-0004935 A | 1/2005 |
| TW | 200712429 | 4/2007 |
| TW | 201305921 A1 | 2/2013 |
| TW | 201621856 A | 6/2016 |
| TW | 201931308 A | 8/2019 |

* cited by examiner

METHOD FOR ALIGNING TO A PATTERN ON A WAFER

BACKGROUND OF THE INVENTION

1. Field of the Invention

The present invention relates to the field of semiconductor technology. More specifically, the present invention relates to a method for inline aligning to a pattern on a wafer.

2. Description of the Prior Art

In semiconductor manufacturing, to monitor the process and ensure correct dimensions of the patterns formed on the wafer, inspection steps such as measurement steps are usually inserted in the manufacturing process for obtaining real-time inline measurement data. The correct alignment to the pattern to be measured (for example, testkey patterns) during the measurement step is important to improve production efficiency and process yield.

SUMMARY OF THE INVENTION

The present invention is directed to provide a method for aligning to a pattern on a wafer. More specifically, the method provided by the present invention includes the steps of setting a metrology system to align to a tested pattern on a tested wafer and perform a measurement to the tested pattern after successfully recognizing an alignment mark pattern on the tested wafer. It has been practiced and verified that the method provided by the present invention, using a high contrast pixelated black-and-white image as a reference image to recognize the alignment mark pattern on the tested wafer may achieve a higher recognition rate, thus increasing the measurement efficiency and reducing the burden of inline process control.

According to an embodiment of the present invention, a method for aligning to a pattern on a wafer is disclosed, and includes the steps of obtaining a first inline image from a first sample wafer, obtaining a first contour pattern of an alignment mark pattern from the first inline image, using the first contour pattern to generate a first synthetic image in black and white pixels, using the first synthetic image as a reference to recognize the alignment mark pattern on a tested wafer, and aligning to a tested pattern on the tested wafer according to a coordinate information based on a position of the alignment mark pattern on the tested wafer.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, features and advantages of the present invention more obvious and understandable, the preferred embodiments are described in detail below together with the attached drawings. The attached drawings are schematic and are not drawn to scale, and the same or similar features are usually described using the same symbols. The embodiments and accompanying drawings described herein are for reference and illustration purposes only and are not intended to limit the present invention. The scope of the present invention is defined by the appended claims, along with the full scope of equivalents to which such claims are entitled.

Figure 1:
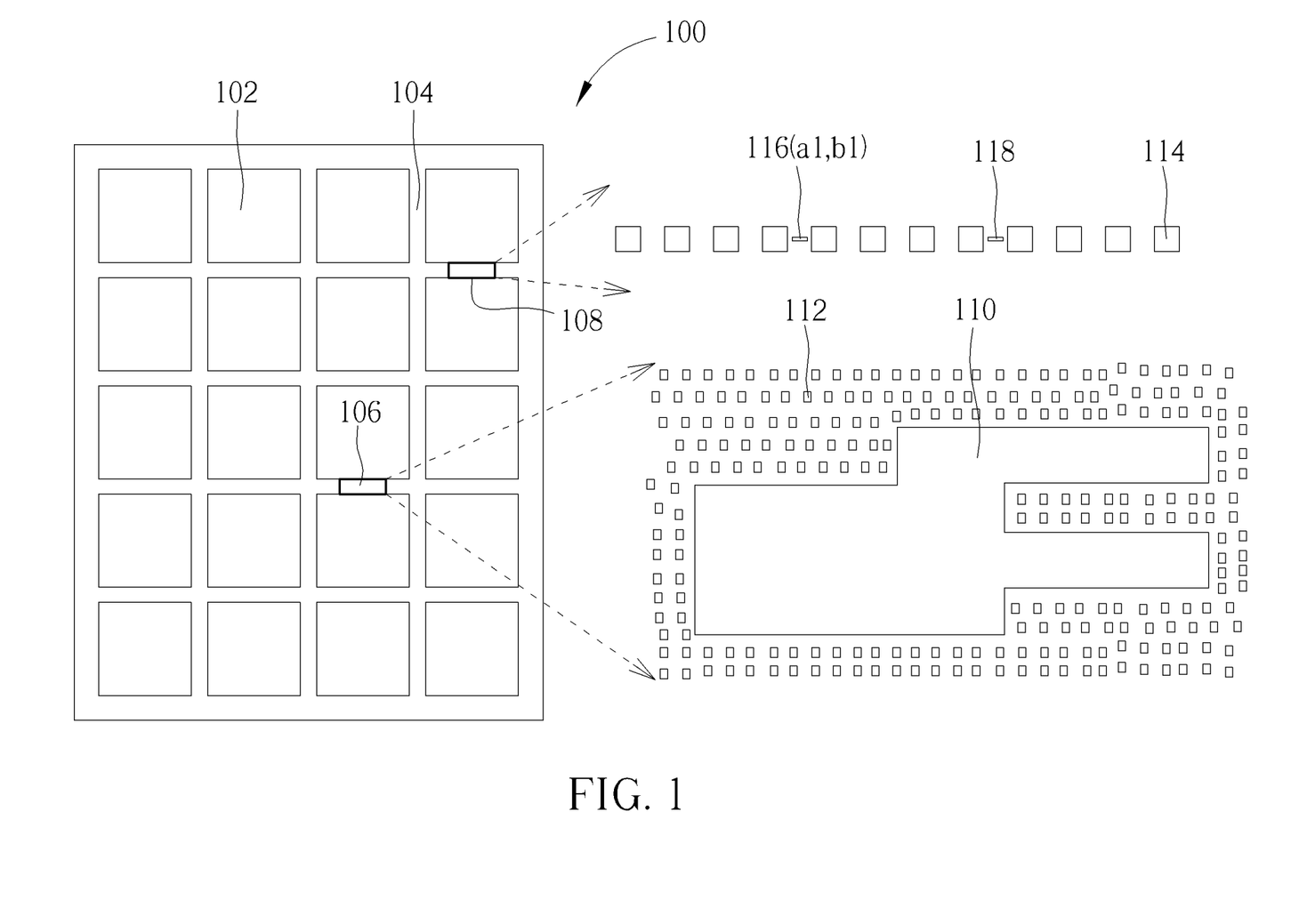
FIG. 1 is a schematic plane view of a semiconductor layout and an enlarged schematic plane view of an alignment mark region of the semiconductor layout according to an embodiment of the present invention.

Please refer to FIG. 1. The left side of FIG. 1 shows a schematic plane view of a semiconductor layout 100 according to an embodiment of the present invention. The right side of FIG. 1 shows an enlarged schematic plane view of an alignment mark region 106 of the semiconductor layout 100. The semiconductor layout 100 may include multiple layout layers (for example, an active region layer, a gate layer, a plurality of implanted region layers, and a plurality of interconnection layers, but are not limited thereto) that would be transferred to respective photomasks used in semiconductor manufacturing process for patterning the material layers on a wafer to construct the 3D structures of integrated circuits layer by layer. According to an embodiment of the present invention, as shown in the left side of FIG. 1, the semiconductor layout 100 may include multiple chip regions 102 and a scribe line region 104 between the chip regions 102 and separating the chip regions 102. The chip regions 102 may include the patterns of integrated circuits, and the scribe line region 104 may include patterns for inline process control and off-line electrical analysis, such as alignment marks, measuring structures, and testkeys. For example, as shown in the left side and the right side of FIG. 1, the scribe line region 104 may include at least an alignment mark region 106, and the alignment mark region 106 may include an alignment mark pattern 110. The scribe line region 104 may further include at least a testkey region 108, and the testkey region 108 may include a plurality of conductive pad patterns 114 arranged along an extending direction of the scribe line region 104 and a testkey pattern 116 and a testkey pattern 118 disposed between the conductive pad patterns 114. According to an embodiment of the present invention, the semiconductor layout 100 may further include a plurality of dummy patterns 112 disposed in the chip regions 102 and the scribe line region 104 to adjust the pattern density and reduce process loading effects due to pattern density variation, thus the designed patterns of integrated circuits may be better reproduced on the wafer and a better pattern quality may be obtained. For the sake of simplicity, only the dummy patterns 112 in the alignment mark region 106 are shown in FIG. 1. It should be understood that the shapes and positions of the patterns illustrated in FIG. 1 are examples for illustrative purposes and are not intended to limit the scope of the present invention.

Figure 2:
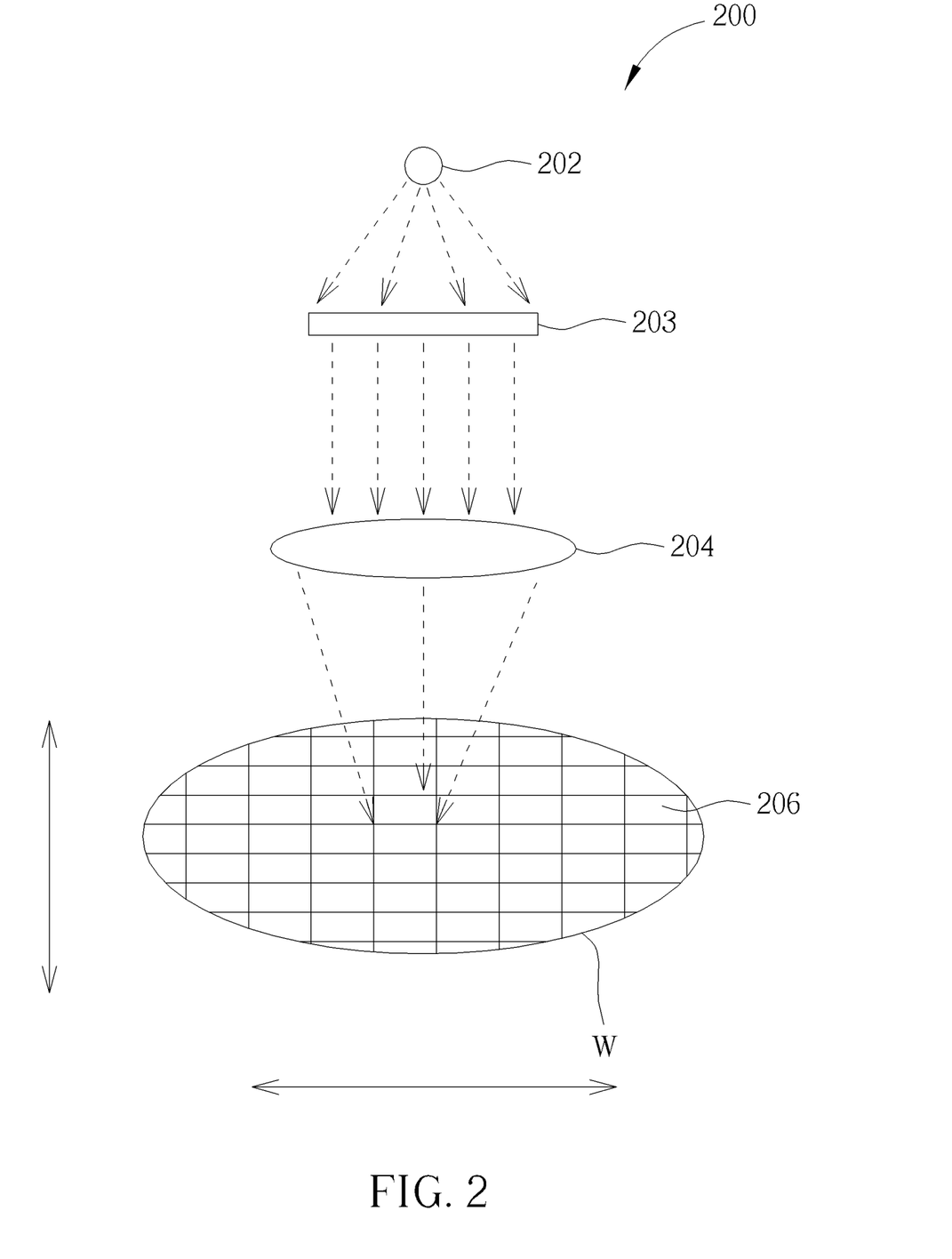
FIG. 2 is a schematic diagram illustrating a photolithography system according to an embodiment of the present invention.

Please refer to FIG. 2, which is a schematic diagram illustrating a photolithography system 200 according to an embodiment of the present invention. The photolithography system 200 is used to transfer the layout patterns from the mask 203 to the wafer W. More specifically, the patterns of the semiconductor layout 100 shown in FIG. 1 may be transferred to the mask 203, and then transferred to the wafer W by using the photolithography system 200. The photolithography system 200 may include a stepper or a scanner to expose photosensitive materials on the wafer W, but is not limited thereto. The mask 203 may also be referred to as a photomask or a reticle, and may be a binary photomask, a phase shift photomask (PSM), or other suitable types of photomasks. According to an embodiment of the present invention, the patterns of the semiconductor layout 100 shown in FIG. 1 may be transferred to the mask 203, and then the pattern of the mask 203 is transferred to the wafer W by the photolithography system 200. During an exposure process, the light with a proper wavelength emitted from the light source 202 of the photolithography system 200 is directed through the mask 203 and the lens 204 to expose portions of a photoresist layer (not shown) on the wafer W and change the properties of the exposed portions of the photoresist layer. Subsequently, a development process is performed to develop and remove exposed portions or non-exposed portions of the photoresist layer, depending on whether the photoresist layer is positive type or negative type, thereby transferring the pattern of the mask 203 to the photoresist layer remained on the wafer W. By successively moving the wafer W and repeating the exposure process until the photoresist layer throughout the wafer is exposed and developed, an array of exposure fields 206 defined by the mask 203 may be formed on the wafer W. The patterns of the photoresist layer may be transferred to the wafer by semiconductor processes (such as film deposition, etching, polishing, but are not limited thereto). In some embodiments, the photoresist layer may be used as an etching mask of an etching process, or may be used as an implantation mask of an implanting process.

To monitor the patterning process and ensure correct dimensions of the patterns formed on the wafer, an inline measurement step may be performed to obtain metrology data. According to an embodiment of the present invention, to facilitate a correct alignment to the tested pattern 116 and perform the measurement, the alignment mark pattern 110 (has a larger dimension and is more prominent to be recognized by the metrology system) may be used to obtain a coordinate information of the testkey pattern 116 (for example, the coordinates (a1, b1) shown in FIG. 1) based on the position of the alignment mark pattern 110. The coordinate information of the testkey pattern 116 is stored in the metrology system for aligning to the testkey pattern 116 and performing measurement to the testkey pattern 116 after the metrology system recognizing the alignment mark pattern 110. More specifically, the measurement may include the following procedure: after successfully recognizing the alignment mark pattern 110, aligning to the testkey pattern 116 according to the coordinates (a1, b1) and performing measurement.

Figure 3:
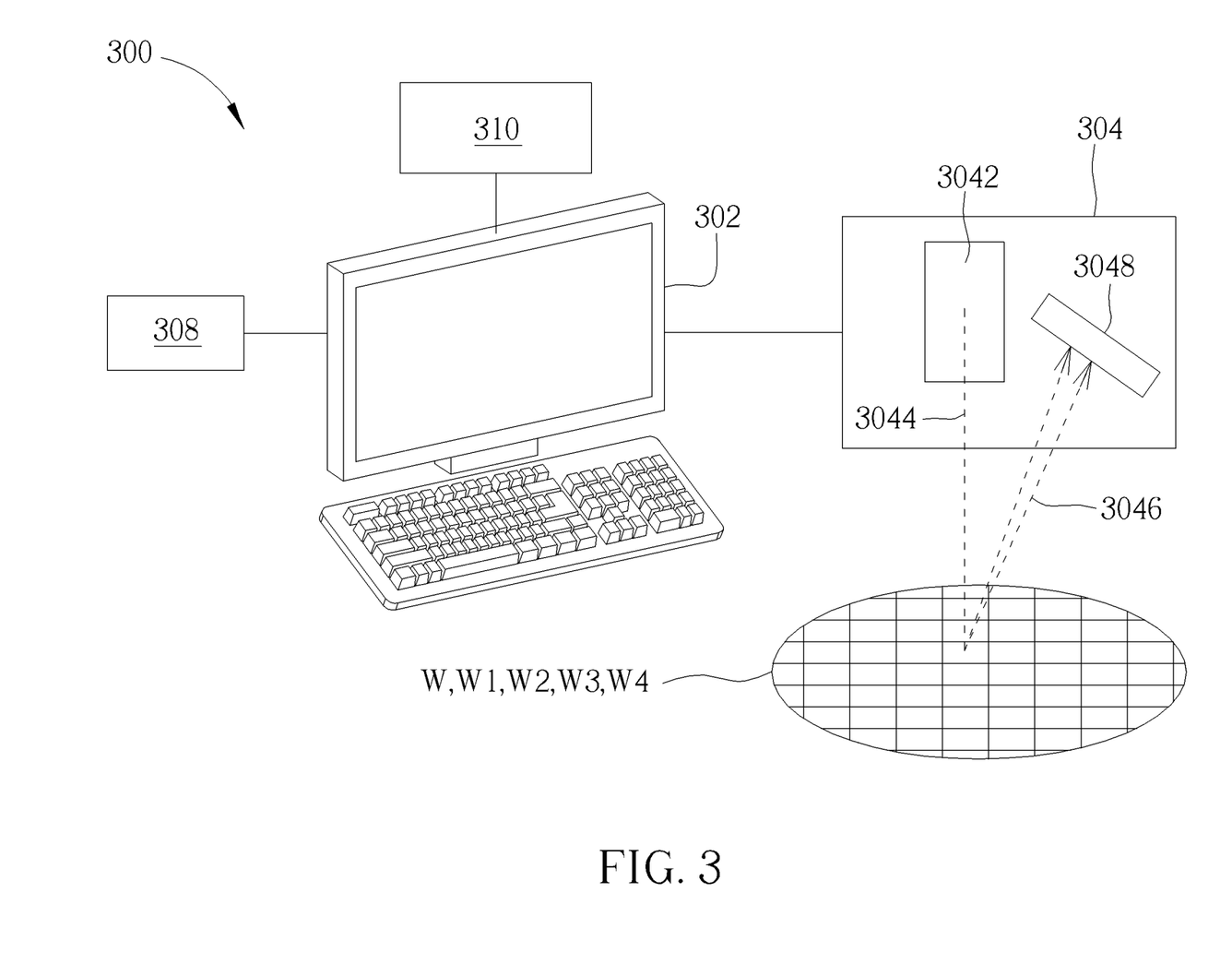
FIG. 3 is a schematic diagram illustrating a metrology system for measuring a wafer according to an embodiment of the present invention.

Please refer to FIG. 3, which is a schematic diagram illustrating a metrology system 300 for measuring a pattern on the wafer W according to an embodiment of the present invention. The metrology system 300 may be a stand-alone metrology system, or may be integrated into the processing equipment for producing the semiconductor integrated circuits. As shown in FIG. 3, the metrology system 300 may include a computer device 302 that communicates with the measurement unit 304, the memory 310, and the user interface 308 through any suitable communication interface (for example, wire cables, wireless communications, direct communications, or local area networks, but are not limited thereto). The measurement unit 304 is configured to receive commands from the computer device 302 and obtain an inline image of the wafer W according to the commands. The measurement unit 304 may include any suitable imaging devices. According to an embodiment of the present invention, the measurement unit 304 may include an optical imaging device, which may include a light source 3042 configured to emit the light 3044 onto an aligned region on the wafer W, and a light sensor 3048 configured to detect the reflected light signal 3046 reflected from the wafer. The reflected light signal 3046 is processed by computer device 302 and output as a pixelated inline image in grayscale pixels.

In the following description, methods for aligning to a pattern on a wafer according to some embodiments of the present invention are disclosed. The methods may be applied to any inline measurement steps using the metrology system 300 as shown in FIG. 3, or may be applied to any inspection steps that require the alignment to a pattern on a tested wafer. One feature of the present invention is that, the methods provided by the present invention includes the innovative steps of: storing a synthetic image of an alignment mark pattern in the metrology system, recognizing the alignment mark pattern on a tested wafer by using the synthetic image as a reference, and aligning to a tested pattern (such as a testkey pattern) on the tested wafer according to a coordinate information of the tested pattern based on the position of the alignment mark pattern. In this way, the recognition rate of successfully aligning to the tested pattern for performing measurement may be increased.

Figure 4:
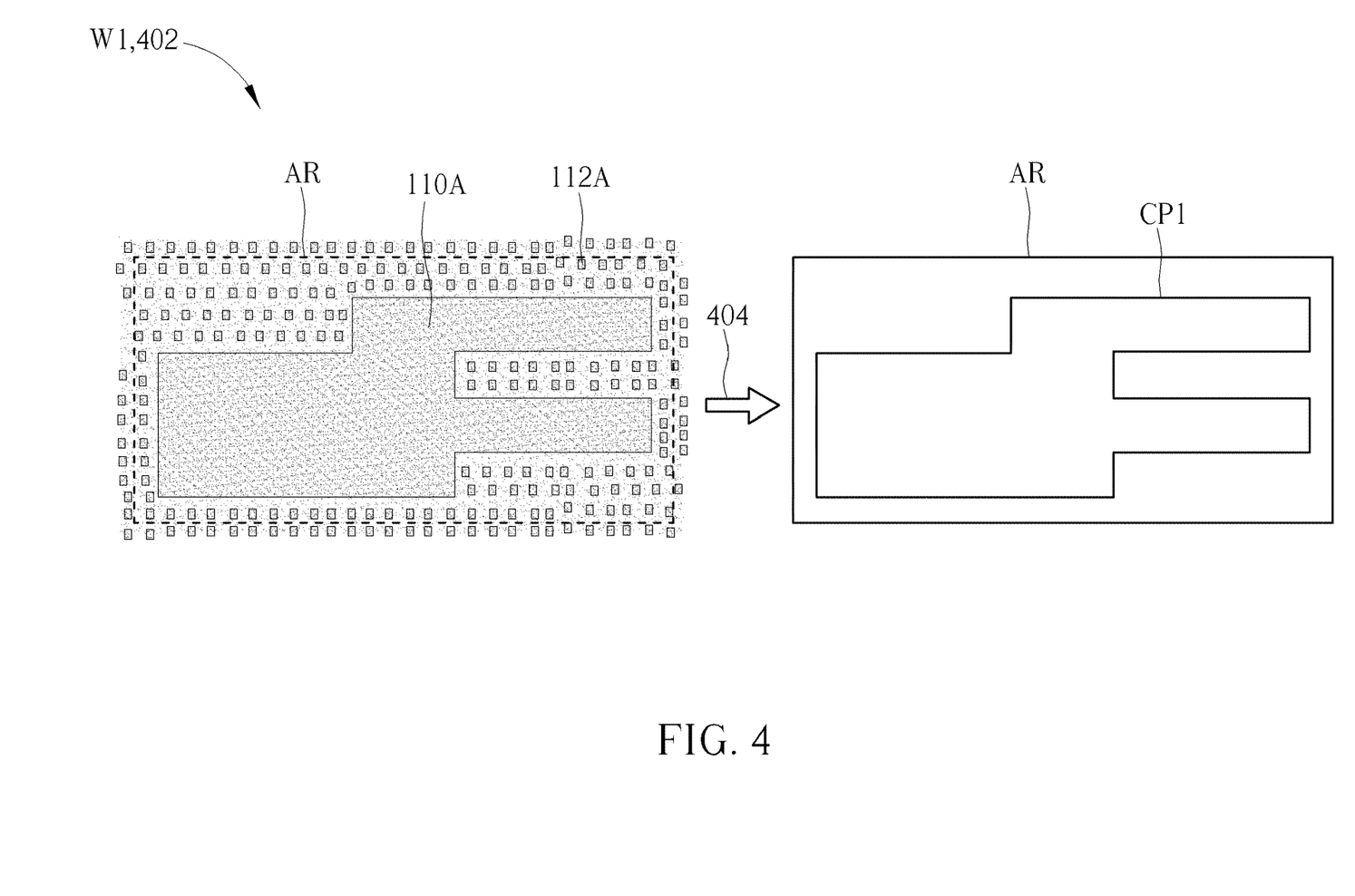
FIG. 4, FIG. 5, FIG. 6, and FIG. 7 are schematic diagrams illustrating the steps of a method for aligning to a pattern on a wafer according to an embodiment of the present invention.
Figure 5:
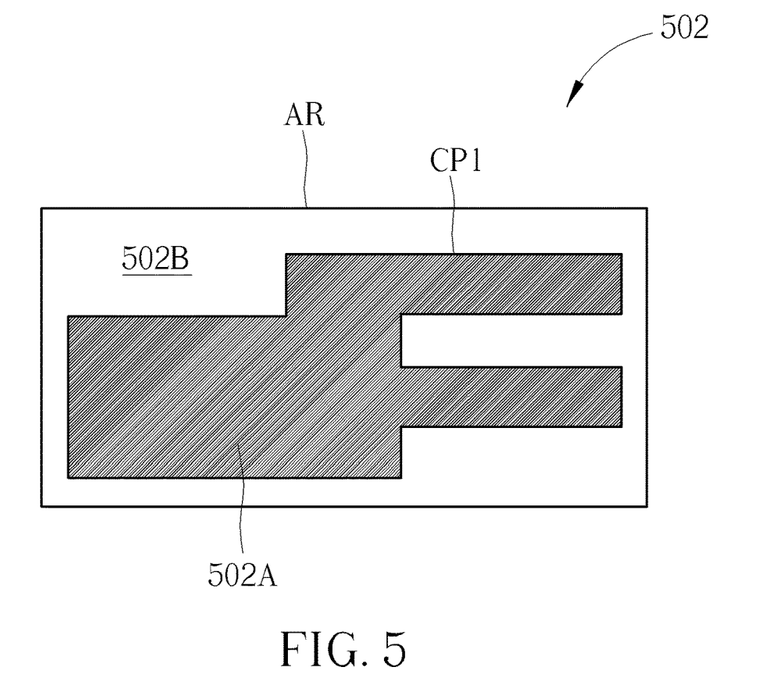
Figure 6:
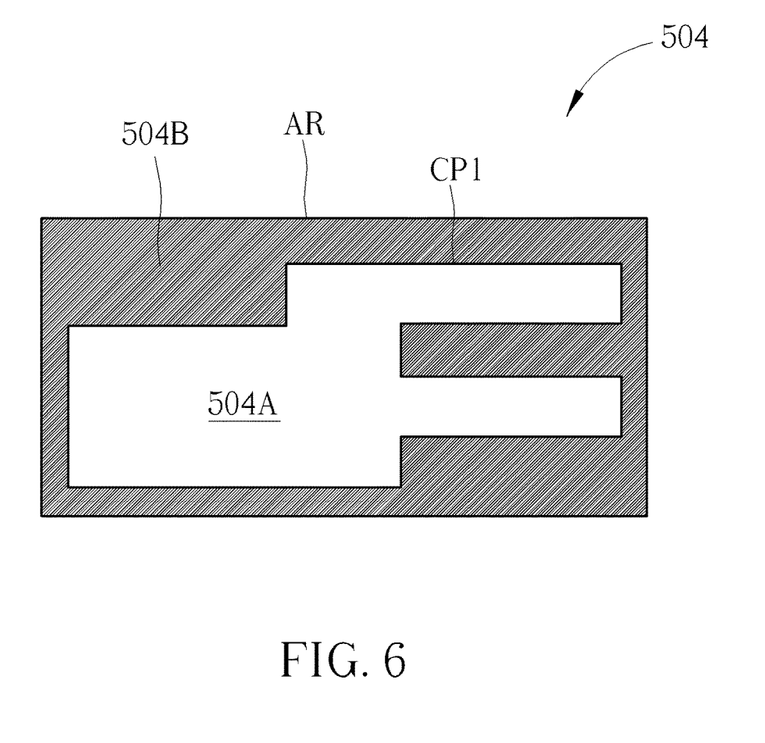
Figure 9:
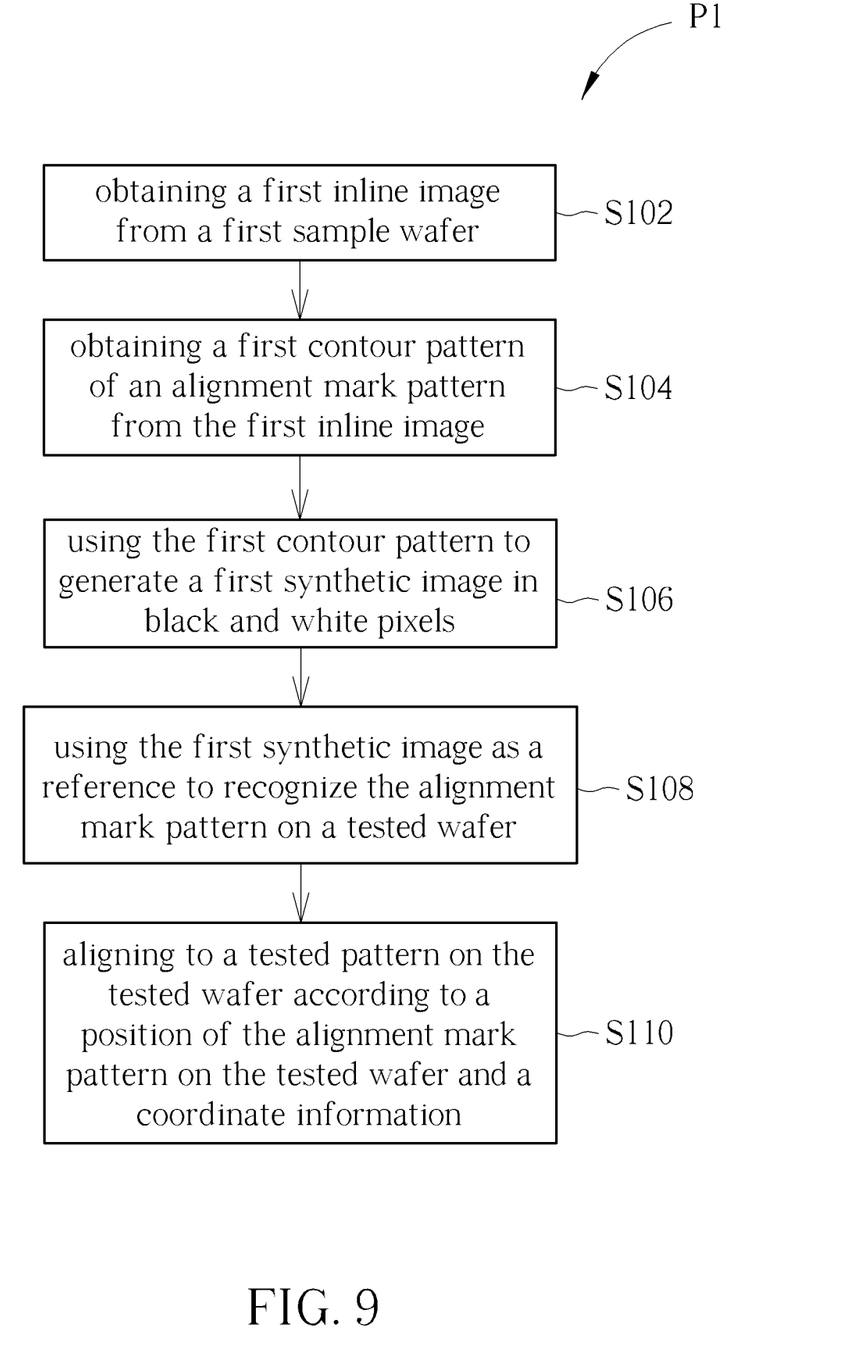
FIG. 9 shows a flow chart of the steps of a method for aligning to a pattern on a wafer according to an embodiment of the present invention.

Please refer to FIG. 3, FIG. 4, FIG. 5, FIG. 6, FIG. 7 and FIG. 9. FIG. 9 illustrates a flow chart of the steps of a method P1 for aligning to a pattern on a wafer according to an embodiment of the present invention. FIG. 4, FIG. 5, and FIG. 6 are schematic diagrams corresponding to the steps of method P1. The method P1 may be performed by using the metrology system 300.

First, the step S102 of the method P1 is performed to obtain a first inline image from a first sample wafer. For example, as shown in FIG. 3 and the left side of FIG. 4, after the pattern (for example, the pattern of the integrated circuit in the chip regions, the pattern of the alignment marks in the scribe line region, the pattern of the testkeys) being transferred to a first sample wafer W1, the first sample wafer W1 is transferred to the metrology system 300 to obtain a first inline image 402 of the first sample wafer W1. The first inline image 402 is a pixelated image in grayscale pixels and may include a recognition region AR and an alignment mark pattern 110A in the recognition region AR. In some embodiments, the first inline image 402 may also include a plurality of dummy patterns 112A surrounding the alignment mark pattern 110A. It should be noted that, comparing to the alignment mark pattern on the mask, the alignment mark pattern 110A formed on the first sample wafer W1 may have features such as corner rounding or line-end shorting caused by the semiconductor process.

Subsequently, step S104 is performed to obtain a first contour pattern of an alignment mark pattern from the first inline image. For example, as shown in FIG. 3 and the right side of FIG. 4, the computer device 302 of the metrology system 300 may perform an image processing 404 on the first inline image 402 to obtain a first contour pattern CP1 of the alignment mark pattern 110A.

Subsequently, step S106 is performed, using the first contour pattern to generate a first synthetic image in black and white pixels. For example, as shown in FIG. 3 and FIG. 5, the computer device 302 of the metrology system 300 may be used to generate a first synthetic image 502 based on the first contour pattern CP1. It should be noted that the first synthetic image 502 is a pixelated image in black and white pixels. According to an embodiment of the present invention, the first synthetic image 502 may include a black pixel region 502A defined by the first contour pattern CP1 and a white pixel region 502B surrounding the black pixel region 502A. The first synthetic image 502 is stored in the memory 310 of the metrology system 300 as a reference image for recognizing the alignment mark pattern formed on a tested wafer (such as the tested wafer W3). It should be noted that, in the present invention, an image is referred as "in black and white pixels" when the image is a pixelated image including pixels of two grayscale levels (the black pixel and the white pixel), and may be also referred to be a "black-and-white image". An image is referred as "in grayscale pixels" when the image is a pixelated image including pixels of gradient grayscale levels, and may be also referred to be a "grayscale image".

Subsequently, step S108 is performed, using the first synthetic image as a reference to recognize the alignment mark pattern on a tested wafer. Afterward, step S110 is performed to align to a tested pattern on the tested wafer according to a position of the alignment mark pattern on the tested wafer and a coordinate information based on the position of the alignment mark pattern, and then performing measurement to the tested pattern. For example, as shown in FIG. 3, a tested wafer W3 may be transferred to the metrology system 300, and an inline image including the alignment mark pattern 110A on the tested wafer W3 is obtained. The computer device 302 may match and compare the inline image of the tested wafer W3 and the first synthetic image 502 stored in the memory 310. When the matching result achieves a pre-determined score of matching quality, the computer device 302 determines that the alignment mark pattern 110A on the tested wafer W3 is successfully recognized, and then proceeds to align the measurement unit 304 to a tested pattern (for example, the testkey pattern 116) on the tested wafer W3 according to a coordinate information stored in the memory 310, and then performing measurement to the tested pattern.

It should be noted that the present invention is not limited to measuring dimensional data of the tested pattern on the tested wafer. The present invention may be applied to any inline inspection step that includes the steps of recognizing an alignment mark pattern and then aligning to another pattern region according to a coordinate information. For example, the present invention may also be applied to defect detection steps.

According to an embodiment of the present invention, a second synthetic image may be obtained by reversing the colors of the black and white pixels of the first synthetic image (that is, reversing the black pixel to a white pixel and vice versa), and both of the first synthetic image and the second synthetic image may be used as reference images for recognizing the alignment mark pattern on the tested wafer. For example, as shown in FIG. 3, FIG. 5 and FIG. 6, the computer device 302 may perform a color reversing process to the first synthetic image 502 as shown in FIG. 5 and produce a second synthetic image 504 as shown in FIG. 6. The black pixel region 502A and the white pixel region 502B of the first synthetic image 502 become the white pixel region 504A and the black pixel region 504B of the second synthetic image 504, respectively, after the color reversing process. The first synthetic image 502 and the second synthetic image 504 are stored in the memory 310 of the metrology system 300, and the computer device 302 may choose one or both of the first synthetic image 502 and the second synthetic image 504 as reference images when matching the inline image of the tested wafer W3. In this way, the recognition rate may be further improved.

Figure 7:
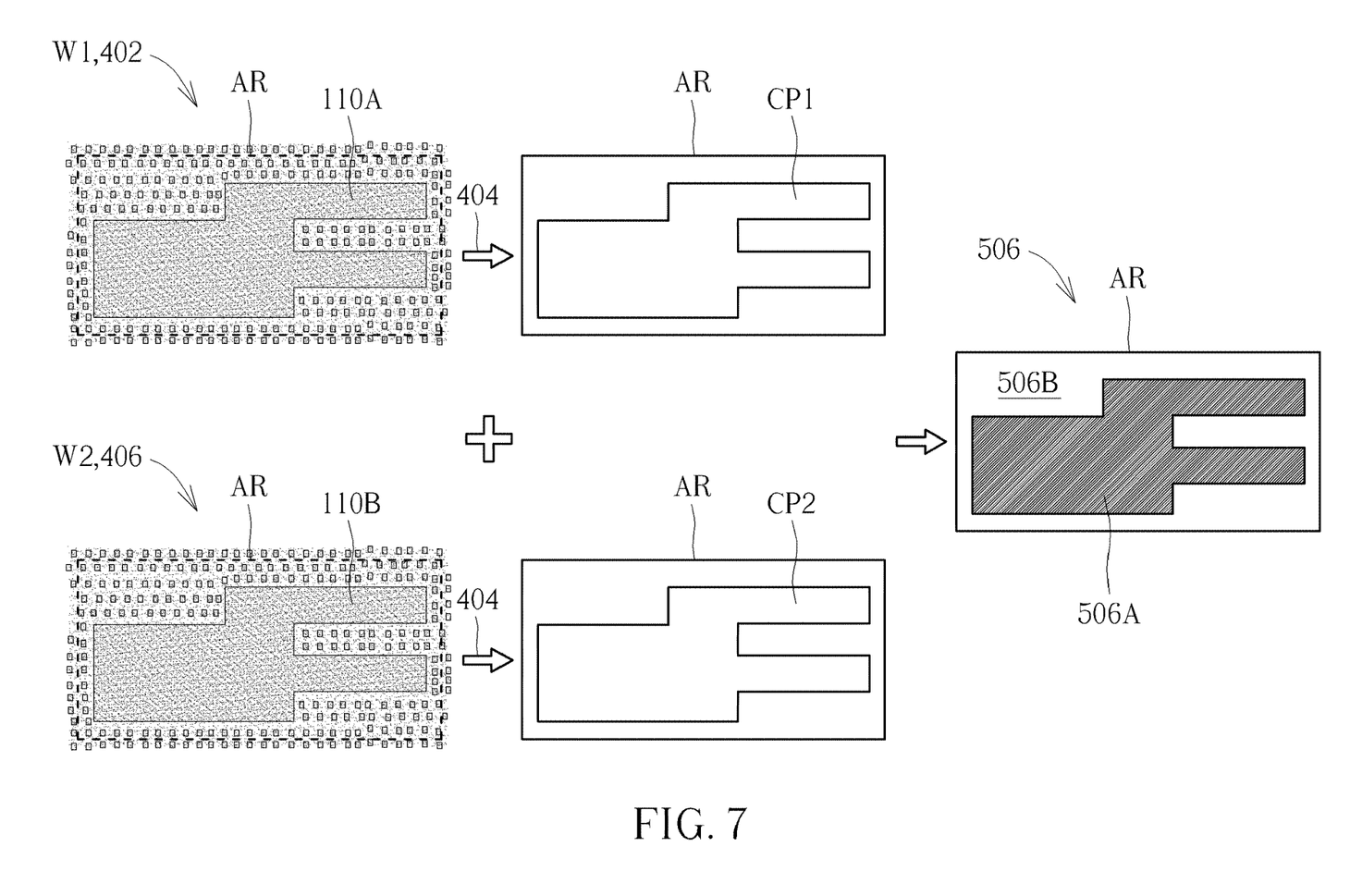

According to an embodiment of the present invention, a second inline image of the alignment mark pattern may be obtained from a second sample wafer, and a second contour pattern of the alignment mark pattern may be obtained from the second inline image. The first contour pattern and the second contour pattern may be used together to generate the first synthetic image. For example, as shown in FIG. 3 and FIG. 7, a second sample wafer W2 may be transferred to the metrology system 300 to obtain a second inline image 406 of the second sample wafer W2. The second inline image 406 is a pixelated image in grayscale pixels and may include a recognition region AR and an alignment mark pattern 110B in the recognition region AR. The computer device 302 of the metrology system 300 may perform an image processing 404 on the second inline image 406 to obtain a second contour pattern CP2 of the alignment mark pattern 110B. According to an embodiment of the present invention, due to manufacturing process variation, the alignment marker pattern 110A of the first inline image 402 and the alignment marker pattern 110B of the second inline image 406 may have different degrees of corner rounding or line-end shorting, or different grayscale levels, so that the first contour pattern CP1 and the second contour pattern CP2 may be slightly different. The computer device 302 of the metrology system 300 may proceed to generate a first synthetic image 506 based on both of the first contour pattern CP1 and the second contour pattern CP2, wherein the first synthetic image 506 is a pixelated image in black and white pixels. According to an embodiment of the present invention, the first synthetic image 506 may include a black pixel region 506A and a white pixel region 506B surrounding the black pixel region 502A. The first synthetic image 506 is stored in the memory 310 of the metrology system 300 as a reference image for recognizing the alignment mark pattern formed on a tested wafer (such as the tested wafer W3).

It should be noted that the first sample wafer W1, the second sample wafer W2, and the tested wafer W3 in the embodiments shown in FIG. 3, FIG. 4, FIG. 5, FIG. 6, FIG. 7, and FIG. 9, having the same alignment mark pattern formed thereon, are not limited to be produced through a same manufacturing process or be a same product. State differently, the present invention may be applied as long as the photomasks for producing the first sample wafer W1, the second sample wafer W2, and the tested wafer W3, have the same alignment mark pattern. In some embodiments, the first sample wafer W1, the second sample wafer W2, and the tested wafer W3 may be produced through the same manufacturing process and may include the same material layers on the surface thereof at the measurement step. In some embodiments, the first sample wafer W1, the second sample wafer W2, and the tested wafer W3, may be produced through different manufacturing processes, and/or may include different material layers on the surface thereof at the measurement step. In some embodiments, the first sample wafer W1, the second sample wafer W2, and the tested wafer W3, may be produced through the same manufacturing process and using a same set of photomasks. In other words, the first sample wafer W1, the second sample wafer W2, and the tested wafer W3, are the same product, having the same material layers on the surface thereof, and are measured at the same measurement step.

Figure 8:
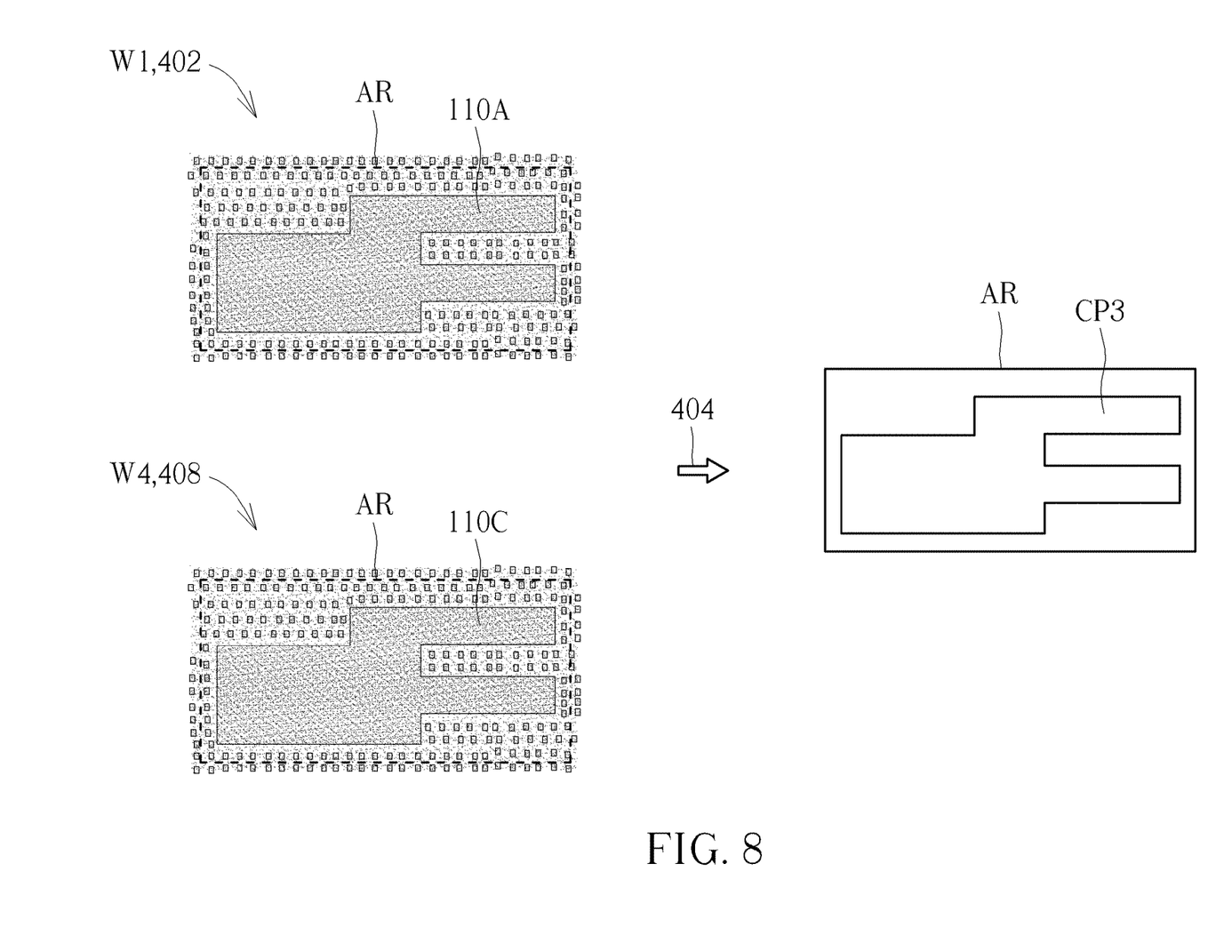
FIG. 8 is a schematic diagram illustrating the steps of a method for aligning to a pattern on a wafer according to an embodiment of the present invention
Figure 10:
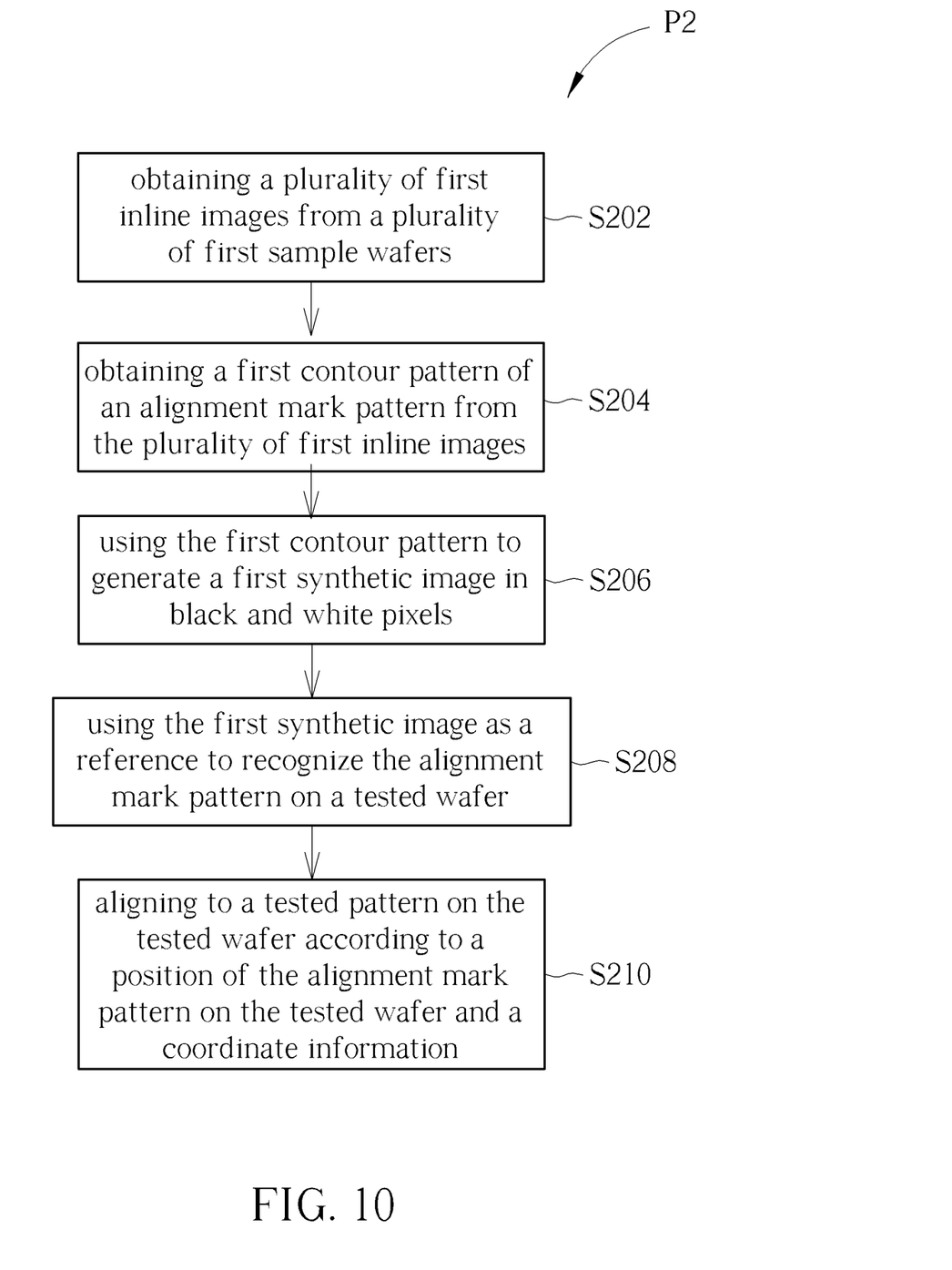
FIG. 10 shows a flow chart of the steps of a method for aligning to a pattern on a wafer according to an embodiment of the present invention.

Please refer to FIG. 8 and FIG. 10. FIG. 10 illustrates a flow chart of the steps of a method P2 for aligning to a pattern on a wafer according to an embodiment of the present invention. FIG. 8 is a schematic diagram illustrating the steps of method P2. The method P2 may be performed by using the metrology system 300 as shown in FIG. 3. The method P1 and the method P2 are different in that, the method P2 obtains the first contour pattern from a plurality of first inline images.

As shown in FIG. 10, first, the step S202 of the method P2 is performed to obtain a plurality of first inline images from a plurality of first sample wafers. For example, as shown in the left side of FIG. 8, a first inline image 402 and a first inline image 408 (both are pixelated images in grayscale pixels) may be obtained from a first sample wafer W1 and a first sample wafer W4, respectively. The first inline image 402 includes an alignment mark pattern 110A. The first inline image 408 includes an alignment mark pattern 110C. According to an embodiment of the present invention, due to manufacturing process variation, the alignment marker pattern 110A of the first inline image 402 and the alignment marker pattern 110C of the first inline image 408 may have different degrees of corner rounding or line-end shorting, or different grayscale levels. That is, the first inline image 402 and the first inline image 408 may be slightly different.

Subsequently, step S204 is performed to obtain a first contour pattern of the alignment mark pattern from the plurality of first inline images. For example, as shown in the right side of FIG. 8, an image processing 404 may be performed (for example, performed by the computer device 302 of the metrology system 300 shown in FIG. 3) on the first inline image 402 and the first inline image 408, combining the features of the alignment mark pattern 110A and the alignment pattern mark 110C, to obtain a first contour pattern CP3.

Following, step S206 is performed to generate a first synthetic image (in black and white pixels). Step S208 is then performed, using the first synthetic image as a reference to recognize the alignment mark pattern on a tested wafer. Afterward, step S210 is performed to align to a tested pattern on a tested wafer according to a position of the alignment mark pattern on the tested wafer and a coordinate information and perform measurement to the tested pattern. Detailed descriptions with respect to the step S206, step S208, and step S210 of the method P2 may be referred to previous descriptions with respect to the step S106, step S108, and step S110 of the method P1, and would not be repeated herein for the sale of simplicity. It should be understood that in some embodiments, the method P2 may further include reversing the colors of the black and white pixels of the first synthetic image to obtain a second synthetic image (similar to the embodiment shown in FIG. 5 and FIG. 6), and then using the first synthetic image and the second synthetic image as a references to recognize the alignment mark pattern on the tested wafer. In some embodiments, the method P2 may further include obtaining a second inline image having the alignment mark pattern from a second sample wafer (similar to the embodiment shown in FIG. 7), obtaining a second contour pattern of the alignment mark pattern from the second inline image, and using the first contour pattern and the second contour pattern to generate the first synthetic image.

In some embodiments, the first sample wafer W1 and the first sample wafer W4 illustrated in method P2 may be produced through the same manufacturing process, or may include the same material layers on the surface thereof at the measurement step. In some embodiments, the first sample wafer W1 and the first sample wafer W4 may be produced through different manufacturing processes, or may include different material layers on the surface thereof at the measurement step. In some embodiments, at least one of the first sample wafer W1 and the first sample wafer W4 may be produced through the same manufacturing process for producing the tested wafer, or may include the material layers the same as the material layers of the tested wafer at the measurement step. In some embodiments, at least one of the first sample wafer W1 and the first sample wafer W4 may be produced through a manufacturing process and photomasks the same as the tested wafer W3. In other words, at least one of the first sample wafer W1 and the first sample wafer W4 and the tested wafer W3 are the same product and may be measured at the same process stage when the wafer surfaces thereof include the same material layers.

In summary, a main feature of the methods for aligning to a pattern on a wafer provided in the various embodiments of the present invention is that, a synthetic image of the alignment mark pattern is stored in the metrology system as a reference for recognizing the alignment mark pattern on a tested wafer. After recognizing the alignment mark pattern on the tested wafer, the metrology system may proceed to align to a tested pattern (for example, a testkey pattern) easily according to a coordinate information of the tested pattern based on the position of the alignment mark pattern and then performing measurement. It has been verified that the methods provided by the present invention using a high contrast pixelated image in black and white pixels as the reference image to recognize the alignment mark pattern may provide a higher recognition rate, thus increasing the measurement efficiency and reducing the burden of inline human debugging caused by failure to recognize the alignment pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for aligning to a pattern on a wafer, comprising:
   obtaining a first inline image from a first sample wafer and a second inline image from a second sample wafer;
   obtaining a first contour pattern of an alignment mark pattern from the first inline image and a second contour pattern of the alignment mark pattern from the second inline image;
   using the first contour pattern and the second contour pattern to generate a first synthetic image in black and white pixels;
   using the first synthetic image as a reference to recognize the alignment mark pattern on a tested wafer; and
   aligning to a tested pattern on the tested wafer according to a position of the alignment mark pattern on the tested wafer and a coordinate information.

2. The method for aligning to a pattern on a wafer according to claim 1, wherein the first inline image is a grayscale image.

3. The method for aligning to a pattern on a wafer according to claim 1, wherein the first synthetic image comprises a black pixel region defined by the first contour pattern and a white pixel region surrounding the black pixel region.

4. The method for aligning to a pattern on a wafer according to claim 1, wherein the first synthetic image comprises a white pixel region defined by the first contour pattern and a black pixel region surrounding the white pixel region.

5. The method for aligning to a pattern on a wafer according to claim 1, further including:
reversing the colors of the black and white pixels of the first synthetic image to obtain a second synthetic image; and
using the first synthetic image and the second synthetic image as references to recognize the alignment mark pattern on the tested wafer.

6. The method for aligning to a pattern on a wafer according to claim 1, wherein the first sample wafer and the tested wafer are produced through a same manufacturing process.

7. The method for aligning to a pattern on a wafer according to claim 1, wherein the first sample wafer and the tested wafer are produced through different manufacturing processes.

8. The method for aligning to a pattern on a wafer according to claim 1, wherein the first sample wafer and the tested wafer are produced using a same photomask and through a same manufacturing process.

9. A method for aligning to a pattern on a wafer, comprising:
obtaining a plurality of first inline images from a plurality of first sample wafers and a second inline image from a second sample wafer;
obtaining a first contour pattern of an alignment mark pattern from the plurality of first inline images and a second contour pattern of the alignment mark pattern from the second inline image;
using the first contour pattern and the second contour pattern to generate a first synthetic image in black and white pixels;
using the first synthetic image as a reference to recognize the alignment mark pattern on a tested wafer; and
aligning to a tested pattern on the tested wafer according to a position of the alignment mark pattern on the tested wafer and a coordinate information.

10. The method for aligning to a pattern on a wafer according to claim 9, wherein the plurality of first inline images are grayscale images.

11. The method for aligning to a pattern on a wafer according to claim 9, wherein the first synthetic image comprises a black pixel region defined by the first contour pattern and a white pixel region surrounding the black pixel region.

12. The method for aligning to a pattern on a wafer according to claim 9, wherein the first synthetic image comprises a white pixel region defined by the first contour pattern and a black pixel region surrounding the white pixel region.

13. The method for aligning to a pattern on a wafer according to claim 9, further including:
reversing the colors of the black and white pixels of the first synthetic image to obtain a second synthetic image; and
using the first synthetic image and the second synthetic image as references to recognize the alignment mark pattern on the tested wafer.

14. The method for aligning to a pattern on a wafer according to claim 9, wherein the first sample wafers are produced through different manufacturing processes.

15. The method for aligning to a pattern on a wafer according to claim 9, wherein at least one of the first sample wafers and the tested wafer are produced through a same manufacturing process.

16. The method for aligning to a pattern on a wafer according to claim 9, wherein at least one of the plurality of first sample wafers and the tested wafer are produced using a same photomask and through a same manufacturing process.

* * * * *